United States Patent
Nanaumi et al.

[11] Patent Number: 5,380,789
[45] Date of Patent: Jan. 10, 1995

[54] METHOD OF PREPARING VEGETABLE OIL-MODIFIED PHENOLIC RESIN AND LAMINATE PRODUCED BY USING THE SAME

[75] Inventors: Ken Nanaumi; Takeshi Horiuchi; Masahiro Nomoto, all of Shimodate; Mitsuhiro Inoue, Oyama, all of Japan

[73] Assignee: Hitachi Chemical Company, Ltd., Tokyo, Japan

[21] Appl. No.: 104,003

[22] Filed: Aug. 10, 1993

[30] Foreign Application Priority Data

Aug. 17, 1992 [JP] Japan .................................. 4-217811

[51] Int. Cl.6 .......................... C08K 5/41; C08G 8/34
[52] U.S. Cl. ...................................... 524/745; 528/86; 528/90; 528/94; 528/111.5; 528/129; 528/143; 528/230; 528/242; 528/243; 528/245.5; 524/714; 524/724; 524/796; 527/600; 527/602
[58] Field of Search ............... 528/86, 90, 94, 111.5, 528/129, 143, 230, 242, 243, 245.5; 524/714, 724, 745, 796; 527/600, 602

[56] References Cited

U.S. PATENT DOCUMENTS 4,763,133  8/1988  Takemura et al. ................... 343/912

OTHER PUBLICATIONS

CA108(20):168747w.
CA104(6):34855p.
CA103(16):12527v.
CA102(4):25576e.
CA100(20):157546p.
CA173(6):41949m.
CA99(26):213471k.
CA86(4):17853d.
CA119(2):227659w.
CA112(14):12000c.
CA104(4):20242z.

*Primary Examiner*—Samuel A. Acquah
*Attorney, Agent, or Firm*—Antonelli, Terry, Stout & Kraus

[57] ABSTRACT

A catalyst selected from a perfluorosulfonic acid and an anhydride thereof enables a non-conjugated drying oil to react with a phenol to form a phenol-added vegetable oil without causing hydrolysis of the non-conjugated drying oil. The phenol-added vegetable oil is allowed to react with an aldehyde to form a vegetable oil-modified phenolic resin. A laminate produced by impregnating paper with the vegetable oil-modified phenolic resin and laminating and molding the impregnated paper is excellent in low temperature punching quality and electrical properties and is free from low molecular weight components oozing out the surface of the laminate.

15 Claims, No Drawings

METHOD OF PREPARING VEGETABLE OIL-MODIFIED PHENOLIC RESIN AND LAMINATE PRODUCED BY USING THE SAME

BACKGROUND OF THE INVENTION (a) Field of the invention

The present invention relates to a method of preparing a vegetable oil-modified phenolic resin useful as a material of paper-phenol laminates and copper-clad laminates (hereinafter, they will be given a general name of "laminate") and to a laminate which is produced by using the vegetable oil-modified phenolic resin and is excellent in low-temperature punching quality.

(b) Description of the Related Art

Paper-phenol laminates have been pierced or shaped by punching using pierce dies or blank dies. In order to minimize the dimensional change of printed wiring boards, it has become a new tendency to carry out the punching at room temperature without heating, and flexibilized phenolic resins are used for the production of laminates to improve the punching quality of the laminates. The flexibilization of phenolic resins has mainly been performed by using tung oil, which comprises mainly of eleostearic acid and is very reactive or phosphoric esters, such as triphenyl phosphate. However, tung oil, which occur in nature, is inseparable from severe fluctuation of price and is often hardly available due to natural disasters, such as abnormal weather, floodwater and earthquake, or artificial factors, so that they are difficult to supply stably. Also, the flexibilization by using phosphoric esters causes deterioration in the solvent resistance and electrical properties of laminates, thereby making it difficult to improve low temperature punching quality by using phosphoric esters alone.

Some examples of other vegetable oils which have been examined as the alternatives to tung oil are linseed oil and soybean oil, which comprise mainly of linoleic acid or linolenic acid. These vegetable oils however are less reactive with phenols. In order to solve this problem, it has been proposed to allow such vegetable oils to react with phenols under severe reaction conditions, for example, in the presence of large amounts of Lewis acids [Japanese Patent Application Kokai Koho (laid-open) No. 55-3903 and Japanese Patent Application Kokai Koho (laid-open) No. 55-108414]. However, the use of large amounts of Lewis acids also causes hydrolysis of the vegetable oils and increases low molecular weight components, thereby causing problems in that, after the production of laminates, the low molecular weight components and unreacted vegetable oils ooze out of the laminates and the large amounts of catalysts deteriorate the electrical properties of the laminates.

SUMMARY OF THE INVENTION

In consideration of the stable availability, both in price and in supply, of the vegetable oils comprising mainly of linoleic acid or linolenic acid, such as linseed oil and soybean oil, the inventors thought that these vegetable oils would be useful for the flexibilization of laminates if they could be enabled to react with phenols. As the result of study based on the above thought, the inventors have found that using a small amount of a perfluorosulfonic acid or an anhydride thereof as a catalyst makes the vegetable oils comprising mainly of linoleic acid or linolenic acid to react with phenols efficiently without causing the hydrolysis of these vegetable oils, and they have consequently completed the present invention.

That is, the present invention provides a method of preparing a vegetable oil-modified phenolic resin, comprising allowing a phenol to react with a non-conjugated drying oil in the presence of a super acid selected from the group consisting of a perfluorosulfonic acid, a perfluorosulfonic anhydride and a mixture thereof to form a phenol-added vegetable oil, and allowing the phenol-added vegetable oil to react with an aldehyde in the presence of an alkaline catalyst under weakly alkaline conditions to form a vegetable oil-modified phenolic resin.

The present invention further provides a laminate comprising plural sheets of paper impregnated with a cured product of the vegetable oil-modified phenolic resin.

In the method of the present invention, the use of a specific catalyst, namely a perfluorosulfonic acid or an anhydride thereof, enables even vegetable oils comprising mainly of linoleic acid or linolenic acid to react with phenols without causing hydrolysis of the vegetable oils to low molecular weight components. Further, since even a small amount of the catalyst functions sufficiently, the resulting vegetable oil-modified phenolic resin does not deteriorate the electrical properties of laminates. When phenol-added vegetable oils prepared according to the present invention were allowed to react with formaldehyde, and laminates were produced by impregnating paper with the obtained varnish, laminating the impregnated paper and compression molding the laminated composite, no low molecular weight components oozed out of the obtained laminates, and the electrical properties of the laminates were not deteriorated. This shows that the conventional problems are solved.

DESCRIPTION OF THE PREFERRED EMBODIMENT

The non-conjugated drying oil used in the present invention is a vegetable oil comprising mainly of linoleic acid or linolenic acid and may be a drying oil with an iodine value of more than 130 or a semi-drying oil with an iodine value of 100 to 130. Some examples of the non-conjugated drying oil include linseed oil, safflower oil, soybean oil, sesame oil, perilla oil, hempseed oil, rape seed oil and cotton seed oil. Among these, the preferred examples are linseed oil and soybean oil which are inexpensive and can be supplied stably. In particular, linseed oil is preferable because of their high degree of unsaturation. These non-conjugated drying oil may be used individually or in a combination of two or more of them.

Some examples of the phenol which may be used in the present invention include phenol, o-cresol, m-cresol, p-cresol, xylenols, catecol, resorcin, hydroquinone, octylphenols, tert-butylphenols, nonylphenols and bisphenol A. These phenols may be used individually or in a combination of two or more of them.

In the present invention, a super acid selected from the group consisting of a perfluorosulfonic acid and a perfluorosulfonic anhydride and a mixture thereof is used as a catalyst for catalyzing the reaction of the phenol and the non-conjugated drying oil. Some examples of the super acid include fluorosulfonic acid, fluorosulfonic anhydride, trifluoromethanesulfonic acid, trifluoromethanesulfonic anhydride, pentafluoroethanesulfonic acid, pentafluoroethanesulfonic anhydride, heptafluoropropanesulfonic acid, heptafluoropropanesulfonic anhydride, nonafluorobutanesulfonic acid, nonafluorobutanesulfonic anhydride, undecafluoropentanesulfonic acid and undecafluoropentanesulfonic anhydride. The preferred examples are fluorosulfonic acid, trifluoromethanesulfonic acid and trifluoromethanesulfonic anhydride. These super acids may be used individually or in a combination of two or more of them.

Although the ratio of the non-conjugated drying oil to the phenol is not particularly limited, the non-conjugated drying oil and the phenol are preferably used in a non-conjugated drying oil:phenol weight ratio of from 2:8 to 6:4, more preferably from 3:7 to 4:6, in order to improve the properties of laminates highly effectively. If the ratio of the non-conjugated drying oil to the phenol is more than 6:4. curing of the vegetable oil-modified phenolic resin in laminates may be insufficient so as to make the surface of the laminates tacky. If the ratio is less than 2:8, the low temperature punching quality of laminates may be insufficient.

Although the amount of the super acid used for the reaction of the non-conjugated drying oil with the phenol is not particularly limited, it is preferable to use 1 to 0.01 part by weight, particularly 0.01 to 0.5 parts by weight of the super acid per 100 parts by weight of the non-conjugated drying oil. If the amount of the super acid is more than 1 part by weight, the electrical properties of laminates may be deteriorated, and if it is less than 0.01 part by weight, the reaction may slow down and the industrial productivity may be decreased.

The reaction of the non-conjugated drying oil and the phenol may be carried out in the absence or presence of solvents. In consideration of the following reaction with an aldehyde, the reaction is preferably carried out in the absence of solvents. The reaction temperature of the reaction is generally 50° to 200° C. If the reaction temperature is too high, hydrolysis may occur to generate low molecular weight components, thereby deteriorating the properties of laminates. In order to inhibit the generation of low molecular weight components, a reaction temperature of 50° to 120° C. is particularly preferable.

At the time of the reaction of the non-conjugated drying oil and the phenol, xylene resin may be added according to demand. Adding the xylene resin further improves the resistance to alkalis and the electrical properties of laminates.

After the completion of the reaction of the non-conjugated drying oil and the phenol, the phenol-added vegetable oil obtained is allowed to react with an aldehyde in the presence of an alkaline catalyst under weakly alkaline conditions to form resol, namely a vegetable oil-modified phenolic resin. At the time of the reaction for forming the resol, a phenol may be added. The kind of the phenol added may be identical with or different from that of the phenol used for the above reaction with the non-conjugated drying oil.

After the completion of the reaction for forming the phenol-added vegetable oil, the phenol-added vegetable may be separated from the reaction solution, or the reaction solution containing the phenol-added vegetable oil may be used for the reaction for forming resol by adding the aldehyde, the alkaline catalyst and, according to demand, the phenol directly to the reaction solution.

Some examples of the aldehyde which may be used in the present invention include formaldehyde, formalin, acetaldehyde, paraformaldehyde and hexamethylenetetramine. These aldehydes may be used individually or in a combination of two or more of them.

The amount or the aldehyde calculated as formaldehyde is generally 1.1 to 1.6 moles, preferably 1.2 to 1.5 moles, per one mole of the total phenol used in the method of the present invention. If the amount of the aldehyde is less than 1.1 moles or more than 1.6 moles, the punching quality of laminates may be deteriorated.

Some examples or the alkaline catalyst which may be used for the reaction for forming resol include ammonia, trimethylamine, triethylamine and triethanolamine. These alkaline catalysts may be used individually or in a combination of two or more of them. The amount of the alkaline catalyst is generally 0.03 to 0.2 moles, preferably 0.05 to 0.1 moles, per mole of the phenol. If the amount of the alkaline catalyst is less than 0.03 moles, the reaction may take a long time, and curability of the product vegetable oil-modified phenolic resin may be deteriorated, thereby deteriorating the properties of laminates. If it is more than 0.2 moles, the vegetable oil-modified phenolic resin may have an increased molecular weight, which may cause difficulty in impregnation, thereby deteriorating the properties of laminates.

The reaction temperature of the reaction for forming resol is generally 1 to 5 hours, preferably about 2 hours.

The reaction for forming resol may be carried out in the absence of solvents, or in the presence of a solvent, such as methanol, acetone or methyl ethyl ketone.

The method of separating the resulting vegetable oil-modified phenolic resin after the completion of the reaction for forming resol is not particularly limited, and an appropriate method is to dehydrate and concentrate the reaction solution at 40° to 90° C. under reduced pressure.

The laminate of the present invention may be produced by laminating plural sheets of paper impregnated with the vegetable oil-modified phenolic resin and molding the resulting laminate with heat and pressure.

In the production of the laminate of the present invention, first an organic solvent, such as toluene or methanol, is added under atmospheric pressure to the vegetable oil-modified phenolic resin obtained in the manner as described above, to form varnish. Paper is impregnated with the varnish, and the impregnated paper is then freed of solvent by heating to obtain a prepreg. A desired number of the prepreg are laminated to form a laminated composite, which is then molded by heating and pressing to form a laminate. When the laminated composite further has a layer of metal foil, such as copper foil, on one or each side thereof, a metal-clad laminate is produced by heating and pressing the laminate composite. The metal foil may be coated with an adhesive on one side coming into contact with the prepreg.

To the varnish of the vegetable oil-modified phenolic resin may be added various additives, for example, flame retardants which are generally added to phenolic resins, such as bromo-type flame retardants, phosphorus-type flame retardants, nitrogen-type flame retardants and antimony-type flame retardants.

Examples of the paper which may be used in the present invention include cotton paper, linter paper, kraft paper and rayon paper. These paper may be used individually or in a combination of two or more of them.

Prior to the production of the laminate of the present invention, the paper may be impregnated with a water-soluble phenolic resin. Paper impregnated with water-soluble phenolic resins can be easily impregnated with the varnish of the vegetable oil-modified phenolic resin. The water-soluble phenolic resin can be dissolved completely in water or in a solvent mixture of water and alcohols. Some examples of the water-soluble phenolic resin include those obtained by allowing a phenol, such as phenol, a cresol, a xylenol, catecol, resorcin or a nonylphenol, to react with 1 to 3 moles of formaldehyde per mole of the phenol, in the presence of a catalyst, for example, an organic tertiary amine, such as trimethylamine, triethylamine or triethanolamine, or an alkaline or alkaline earth metal hydroxide, such as potassium hydroxide, sodium hydroxide, calcium hydroxide, barium hydroxide or magnesium hydroxide, at 40° to 90° C.

Hereinafter, the present invention will be described in detail referring to the following Examples.

EXAMPLES 1 TO 5, REFERENCE EXAMPLE 1 AND COMPARATIVE EXAMPLES 1 AND 2

EXAMPLE 1

Synthesis of a Varnish for the Preparation of Laminates

In a two-liter three neck flask equipped with a thermometer and a condenser tube were introduced 200 g of linseed oil, 200 g of phenol and 0.3 g of trifluoromethanesulfonic acid, and were then allowed to react at 80° C. for three hours. After the completion of the reaction, thereto were added 180 g of phenol, 255 g of paraformaldehyde, 80 g of methanol and 38 g of 25% aqueous ammonia and were then allowed to react at 80° C. to form resol. During the reaction, sampling was carried out to determine the gelation time of the reaction mixture at, 160° C. When the gelation time of the reaction mixture at 160° C. decreased to 6 minutes, the reaction mixture was dehydrated and concentrated by heating at 80° C. under reduced pressure. When the gelation time of the reaction mixture decreased to three minutes, the reaction was terminated, and 200 g of toluene and 200 g of methanol were added to the reaction mixture to form a varnish.

EXAMPLE 2

Synthesis of a Varnish for the Preparation of Laminates

In the same flask as that used in Example 1 were introduced 200 g of linseed oil, 250 g of a mixture of m-cresol and p-cresol and 1.0 g of fluorosulfonic acid, and were then allowed to react at 90° C. for two hours. Thereto was added 50 g of a xylene resin (Trade name: NIKANOL-H, produced by Mitsubishi Gas Chemical Co., Inc. ), and the mixture was allowed to react at 90° C. for one hour. Subsequently, thereto were added 100 g of phenol, 177 g of paraformaldehyde, 60 g of methanol and 21.6 g of 25% aqueous ammonia, to carry out a reaction for forming resol at 80° C. When the gelation time of the reaction mixture at 160° C. decreased to 6 minutes, the reaction mixture was dehydrated and concentrated by heating at 80° C. under reduced pressure. When the gelation time decreased to three minutes, the reaction was terminated, and 200 g of toluene and 200 g of methanol were added to the reaction mixture to form a varnish.

EXAMPLE 3

Synthesis of a Varnish for the Preparation of Laminates

In the same flask as that used in Example 1 were introduced 200 g of phenol, 50 g of a xylene resin (Trade name: NIKANOL-H, produced by Mitsubishi Gas Chemical Co., inc.) and 1.0 g of trifluoromethanesulfonic acid, and were then allowed to react at 100° C. for one hour. Thereto was added 200 g of soybean oil, and the reaction mixture was then allowed to react at 100° C. for 5 hours. Subsequently, thereto were added 180 g of phenol, 255 g of paraformaldehyde, 80 g of methanol and 38 g of 25% aqueous ammonia, and the reaction mixture was then allowed to react at 80° C. to form resol. When the gelation time of the reaction mixture at 160° C. decreased to 6 minutes, the reaction mixture was dehydrated and concentrated by heating at 80° C. under reduced pressure. When the gelation time decreased to three minutes, the reaction was terminated, and 200 g of toluene and 200 g of methanol was then added to the reaction mixture to form a varnish.

EXAMPLE 4

Synthesis of a Varnish for the Preparation of Laminates

A varnish was synthesized by the same procedure as that of Example 1 with the exception that 0.3 g of trifluoromethanesulfonic anhydride was used as a catalyst in place of the trifluoromethanesulfonic acid used in Example 1.

EXAMPLE 5

Synthesis of a Varnish for the Preparation of Laminates

A varnish was synthesized by the same procedure as that of Example 2 with the exception that 1.0 g of trifluoromethanesulfonic anhydride was used as a catalyst in place of the fluorosulfonic acid used in Example 2.

Comparative Example 1

Synthesis of a Varnish by a Conventional Method

In the same flask as that used in Example 1 were introduced 200 g of linseed oil, 250 g of a mixture of m-cresol and p-cresol and 1.0 g of p-toluenesulfonic acid, and were then allowed to react at 90° C. for two hours. Thereto was added 50 g of a xylene resin (Trade name: NIKANOL-H, produced by Mitsubishi Gas Chemical Co., Inc.), and the reaction mixture was allowed to react at 90° C. for one hour. Subsequently, thereto were added 100 g of phenol, 177 g of paraformaldehyde, 60 g of methanol and 21.6 g of 25% aqueous ammonia, and the reaction mixture was then allowed to react at 80° C. to form resol. When a sample of the reaction mixture was placed on a plate heated to 160° C. to determine gelation time, the sample separated into gel and oil. After the reaction was carried out for 7 hours, the reaction mixture was dehydrated and concentrated by heating at 80° C. under reduced pressure. When the distillation of distillates stopped, 200 g of toluene and 200 g of methanol were added to the reaction mixture to form a comparative varnish.

REFERENCE EXAMPLE 1

Synthesis of Tung Oil-modified Phenolic Resin

In the same flask as that used in Example 1 were introduced 200 g of phenol, 50 g of a xylene resin (Trade name: NIKANOL-H, produced by Mitsubishi Gas Chemical Co., Inc.) and 1.0 g of p-toluenesulfonic acid, and were then allowed to react at 100° C. for one hour. Thereto was added 200 g of tung oil, and the reaction mixture was then allowed to react at 100° C. for 5 hours. After the completion of the reaction, 180 g of phenol, 255 g of paraformaldehyde, 80 g of methanol and 38 g of 25% aqueous ammonia, and the reaction mixture was then allowed to react at 80° C. to form resol. When gelation time at 160° C. decreased to 6 minutes, the reaction mixture was dehydrated and concentrated by heating at 80° C. under reduced pressure. When gelation time decreased to three minutes, the reaction was terminated, and 200 g of toluene and 200 g of methanol were added to the reaction mixture to form a varnish.

COMPARATIVE EXAMPLE 2

Synthesis of a Linseed Oil-modified Phenolic Resin by using a Lewis Acid Catalyst In the same flask as that used in Example 1 were introduced 200 g of phenol, 200 g of linseed oil and 3 g of aluminum chloride, and were then allowed to react at 100° C. for three hours. Thereto were added 180 g of phenol, 255 g of paraformaldehyde, 80 g of methanol and 38 g of 25% aqueous ammonia, and the reaction mixture was then allowed to react at 80° C. to form resol. When gelation time at 160° C. decreased to 6 minutes, the reaction mixture was dehydrated and concentrated by heating at 80° C. under reduced pressure. When gelation time decreased to three minutes, the reaction was terminated, and 200 g of toluene and 200 g of methanol were added to the reaction mixture to form a comparative varnish.

PRODUCTION OF LAMINATES

After each varnish thus obtained was adjusted to a resin content of 48% by weight, kraft paper pre-impregnated with a water-soluble phenolic resin, which was prepared by allowing one mole of phenol to react with three moles of formaldehyde In the presence of trimethylamine at 60° C. for 8 hours, was impregnated with the varnish and was then dried, to obtain a prepreg of a vegetable oil-modified phenolic resin. A predetermined number of the prepreg and copper foil coated with an adhesive were laminated so that the copper foil formed an outermost layer of the laminated composite. The laminated composite was heated and pressed for one hour at a pressure of 100 kg/cm$^2$ and a temperature of 160° C., to obtain a single-sided copper-clad laminate. The insulation resistance, soldering heat resistance and solvent resistance of the obtained laminates were measured in accordance with JIS-C 6481, and the punching quality of the laminates was measured in accordance with ASTM D-617. The results are listed in Table 1. The contents of low molecular weight components which were generated in the reaction off vegetable oils and phenols and were contained in the vegetable oil-modified phenolic resin were measured by a liquid chromatography, and the results are listed in Table 1.

TABLE 1

| | Conditions | Unit | Ex. 1 | Ex. 2 | Ex. 3 |
|---|---|---|---|---|---|
| Insulation resistance | A | Ω | 8.2 × 10$^{12}$ | 7.4 × 10$^{12}$ | 4.3 × 10$^{12}$ |
| | D-2/100 | Ω | 2.7 × 10$^8$ | 3.1 × 10$^8$ | 2.5 × 10$^8$ |
| Soldering heat resistance | A | sec | 42 | 39 | 36 |
| Resistance to trichloroethylene | In boiling trichloroethylene | | No abnormality for 30 min Punching quality good at 40° C. | No abnormality for 30 min good at 40° C. | No abnormality for 30 min good at 70° C. |
| Content of low molecular weight components | | % | 3 | 4 | 7 |

TABLE 1-continued

| | Conditions | Unit | Ex. 4 | Ex. 5 | Com. Ex. 1 |
|---|---|---|---|---|---|
| Insulation resistance | A | Ω | 3.4 × 10$^{13}$ | 2.1 × 10$^{13}$ | 3.8 × 10$^{10}$ |
| | D-2/100 | Ω | 1.6 × 10$^9$ | 9.6 × 10$^8$ | 6.4 × 10$^6$ |
| Soldering heat resistance | A | sec | 29 | 35 | 2 |
| Resistance to trichloroethylene | In boiling trichloroethylene | | No abnormality for 30 min Good at 40° C. | No abnormality for 30 min Good at 40° C. | Surface whitening in one min Bulging |
| Content of low molecular weight components | | % | 4 | 5 | 3 |

| | Conditions | Unit | Ref. Ex. 1 | Com. Ex. 2 |
|---|---|---|---|---|
| Insulation resistance | A | Ω | 5.9 × 10$^{12}$ | 5.1 × 10$^{10}$ |
| | D-2/100 | Ω | 5.7 × 10$^8$ | 2.4 × 10$^6$ |
| Soldering heat resistance | A | sec | 45 | 16 |
| Resistance to trichloroethylene | In boiling trichloroethylene | | No abnormality for 30 min Good at 40° C. | Surface whitening in one min Bulging ✦✦ |
| Content of low molecular weight components | | % | 5 | 28 |

Bulging ✦✦ : Fine delamination around holes

As apparent from the results listed in Table 1, the copper-clad laminates that were produced by using the vegetable oil-modified phenolic resins prepared in Examples 1 to 5 are excellent in insulation resistance, soldering heat resistance, solvent resistance and punching quality, which stand comparison with those of the copper-clad aminate that was produced by using the phenolic resin prepared in Reference Example 1 by using expensive tung oil. Further, the vegetable oil-modified phenolic resins prepared in Examples 1 to 5 have contents of low molecular weight components which are as small as that of the tung oil-modified phenolic resin prepared in Reference Example 1. This means that the catalyst used in the present invention effectively catalyzes the reaction of non-conjugated drying oils with phenols without causing the hydrolysis of the non-conjugated drying oils, and that the phenolic-added vegetable oil resulting from the above reaction effectively flexibilizes phenolic resins. To the contrary, the insulation resistance, soldering heat resistance, solvent resistance and punching quality of the laminates that were produced by using the vegetable oil-modified phenolic resins prepared in Comparative Examples 1 and 2 by using conventional catalysts were inferior to those of the laminates of the present invention.

Particularly, the vegetable oil-modified phenolic resin prepared in Comparative Example 2 by using a Lewis acid contains a very large amount of low molecular weight components. This means that the Lewis acid used in Comparative Example 2 caused hydrolysis of linseed oil.

What is claimed is:

1. A method of preparing a vegetable oil-modified phenolic resin, comprising allowing a phenol to react with a non-conjugated drying oil in the presence of a super acid selected from the group consisting of a perfluorosulfonic acid, a perfluorosulfonic anhydride and a mixture thereof to form a phenol-added vegetable oil, and allowing the phenol-added vegetable oil to react with an aldehyde in the presence of an alkaline catalyst under weakly alkaline conditions to form a vegetable oil-modified phenolic resin.

2. The method as claimed in claim 1, wherein the reaction of the phenol-added vegetable oil with the aldehyde is carried out in the presence of a phenol and the alkaline catalyst under weakly alkaline conditions.

3. The method as claimed in claim 2, wherein the phenol used in the reaction of the phenol-added vegetable oil is selected from the group consisting of phenol, a cresol, a xylenol, catecol, resorcin, hydroquinone, an octylphenol, a tert-butylphenol, a nonylphenol, bisphenol A and a mixture thereof.

4. The method as claimed in claim 1, wherein the reaction of the phenol with the non-conjugated drying oil is carried out in the presence of a xylene resin and the super acid.

5. The method as claimed in claim 1, wherein the non-conjugated drying oil is selected from the group consisting of linseed oil, safflower oil, soybean oil, sesame oil, perilla oil, hempseed oil, rape seed oil, cotton seed oil and a mixture thereof, the super acid is selected from the group consisting of fluorosulfonic acid, fluorosulfonic anhydride, trifluoromethanesulfonic acid, trifluoromethanesulfonic anhydride, pentafluoroethanesulfonic acid, pentafluoroethanesulfonic anhydride, heptafluoropropanesulfonic acid, heptafluoropropanesulfonic anhydride, nonafluorobutanesulfonic acid, nonafluorobutanesulfonic anhydride, undecafluoropentanesulfonic acid, undecafluoropentanesulfonic anhydride and a mixture thereof.

6. The method as claimed in claim 5, wherein the non-conjugated drying oil is selected from the group consisting of linseed oil, soybean oil and a mixture thereof, and the super acid is selected from the group consisting of trifluoromethanesulfonic acid, trifluoromethanesulfonic anhydride, fluorosulfonic acid and a mixture thereof.

7. The method as claimed in claim 5, wherein the non-conjugated drying oil and the phenol are used in a non-conjugated drying oil:phenol weight ratio of from 2:8 to 6:4, and the super acid is used in an amount of from 1 to 0.01 part by weight per 100 parts by weight of the non-conjugated drying oil.

8. The method as claimed in claim 7, wherein the phenol is selected from the group consisting of phenol, a cresol, a xylenol, catecol, resorcin, hydroquinone, an octylphenol, a tert-butylphenol, a nonylphenol, bisphenol A and a mixture thereof, the aldehyde is selected from the group consisting of formaldehyde, formalin, acetaldehyde, paraformaldehyde, and a mixture thereof, and the alkaline catalyst is selected from the group consisting of ammonia, trimethylamine, triethylamine, triethanolamine and a mixture thereof.

9. The method as claimed in claim 8, wherein the non-conjugated drying oil is linseed oil or soybean oil, the phenol is selected from the group consisting of phenol, m-cresol, p-cresol and a mixture thereof, the super acid is selected from the group consisting of trifluoromethanesulfonic acid, trifluoromethanesulfonic anhydride and fluorosulfonic acid, the aldehyde is paraformaldehyde, and the alkaline catalyst is ammonia.

10. The method as claimed in claim 9, wherein the reaction of the phenol-added vegetable oil with the aldehyde is carried out in the presence of a phenol and the alkaline catalyst under weakly alkaline conditions.

11. The method as claimed in claim 10, wherein the reaction of the phenol with the non-conjugated drying oil is carried out in the presence of a xylene resin and the super acid.

12. A laminate comprising a plural sheets of paper impregnated with a cured product of the vegetable oil-modified phenolic resin prepared by the method of claim 1.

13. The laminate of claim 12 further comprising a sheet of metal foil on a side of the laminate.

14. The laminate of claim 13, wherein the metal foil is copper foil.

15. The method as claimed in claim 1, wherein the non-conjugated drying oil is selected from the group consisting of linseed oil, safflower oil, soybean oil, sesame oil, perilla oil, hempseed oil, rape seed oil, cotton seed oil and a mixture thereof.

* * * * *